(12) United States Patent
Kim et al.

(10) Patent No.: US 9,716,250 B2
(45) Date of Patent: Jul. 25, 2017

(54) ORGANIC ELECTROLUMINESCENT DISPLAY

(71) Applicant: Samsung Display Co., Ltd., Yongin, Gyeonggi-Do (KR)

(72) Inventors: Won Gyun Kim, Yongin (KR); Hae Yun Choi, Yongin (KR)

(73) Assignee: SAMSUNG DISPLAY CO., LTD, Yogin, Gyeonggi-Do (KR)

( * ) Notice: Subject to any disclaimer, the term of this patent is extended or adjusted under 35 U.S.C. 154(b) by 53 days.

(21) Appl. No.: 14/011,515

(22) Filed: Aug. 27, 2013

(65) Prior Publication Data

US 2014/0332762 A1 Nov. 13, 2014

(30) Foreign Application Priority Data

May 13, 2013 (KR) .................. 10-2013-0053944

(51) Int. Cl.
| | |
|---|---|
| H01L 29/08 | (2006.01) |
| H01L 35/24 | (2006.01) |
| H01L 51/00 | (2006.01) |
| H01L 51/52 | (2006.01) |
| H01L 51/50 | (2006.01) |
| H01L 27/32 | (2006.01) |

(52) U.S. Cl.
CPC ...... *H01L 51/5271* (2013.01); *H01L 27/3246* (2013.01); *H01L 51/50* (2013.01); *H01L 51/5012* (2013.01); *H01L 51/5275* (2013.01); *H01L 51/5278* (2013.01); *H01L 27/3211* (2013.01); *H01L 51/5036* (2013.01); *H01L 2251/558* (2013.01)

(58) Field of Classification Search
CPC ................. H01L 51/5012; H01L 51/50; H01L 51/5271; H01L 51/5275; H01L 51/5278
USPC .............................. 257/40, E51.022, E51.018
See application file for complete search history.

(56) References Cited

U.S. PATENT DOCUMENTS

| | | | |
|---|---|---|---|
| 7,129,634 B2 | 10/2006 | Boroson et al. | |
| 2005/0040756 A1* | 2/2005 | Winters et al. | ............... 313/504 |
| 2008/0030128 A1 | 2/2008 | Kim | |
| 2010/0045173 A1* | 2/2010 | Kwon et al. | .................. 313/504 |
| 2011/0038070 A1 | 2/2011 | Nakamata et al. | |

FOREIGN PATENT DOCUMENTS

| | | |
|---|---|---|
| KR | 10-2006-0050875 | 6/2006 |
| KR | 10-2010-7014262 | 8/2010 |
| KR | 102013000742 A | 1/2013 |

(Continued)

*Primary Examiner* — Robert Huber
(74) *Attorney, Agent, or Firm* — Knobbe, Martens, Olson & Bear LLP

(57) ABSTRACT

An organic electroluminescent display is disclosed. The organic electroluminescent display includes a substrate having a pixel region and a non-pixel region, a first electrode disposed on the pixel region, an organic light emitting layer disposed on the first electrode and capable of generating light, a second electrode disposed on the organic light emitting layer and including a conductive material capable of reflecting light, a pixel defining layer disposed on the non-pixel region, and a bump disposed on the pixel region and capable of reflecting light to the substrate. The pixel region may include multiple pixel regions defined in the substrate. The bump may include multiple bumps. At least two bumps may have thicknesses different from each other.

20 Claims, 6 Drawing Sheets

(56) References Cited

FOREIGN PATENT DOCUMENTS

| | | |
|---|---|---|
| KR | 1020140046553 A | 4/2014 |
| TW | 200605721 | 2/2006 |
| TW | 200733374 | 9/2007 |
| TW | 201248845 | 12/2012 |

\* cited by examiner

ORGANIC ELECTROLUMINESCENT DISPLAY

CROSS-REFERENCE TO RELATED APPLICATIONS

This U.S. non-provisional patent application claims priority under 35 U.S.C. §119 to Korean Patent Application No. 10-2013-0053944, filed on May 13, 2013, the entirety of which is incorporated by reference herein.

BACKGROUND

Field

The present disclosure relates to organic electroluminescent displays and, more particularly, to bottom emission type organic electroluminescent displays.

Description of the Related Technology

Generally, an organic electroluminescent display includes an anode, an organic light emitting layer disposed on the anode, and a cathode disposed on the organic light emitting layer. The organic electroluminescent display may display an image using light generated from the organic light emitting layer. Organic electroluminescent displays may be categorized as top emission type organic electroluminescent displays or bottom emission type organic electroluminescent displays. In the top emission type organic electroluminescent display, the light generated from the organic light emitting layer may be transmitted through the cathode and then may be outputted to an external system. In the bottom emission type organic electroluminescent display, the light generated from the organic light emitting layer may be reflected by the cathode and then may be outputted to the external system. Thus, the cathode of the bottom emission type organic electroluminescent display includes a conductive material for reflecting light.

SUMMARY OF CERTAIN INVENTIVE ASPECTS

In one aspect, an organic electroluminescent display is provided, which is capable of increasing intensity of an outputted light.

In another aspect, an organic electroluminescent display is provided, which is capable of outputting uniform intensity of light throughout a pixel region.

In another aspect, an organic electroluminescent display is provided, which is capable of improving display quality.

In another aspect, an organic electroluminescent display is provided. The organic electroluminescent display may include, for example, a substrate having a pixel region and a non-pixel region, a first electrode formed on the pixel region, an organic light emitting layer formed on the first electrode and capable of generating light, a second electrode formed on the organic light emitting layer and including a conductive material capable of reflecting light, a pixel defining layer formed on the non-pixel region, and a bump formed on the pixel region and capable of reflecting light generated from the organic light emitting layer to the substrate. In some embodiments, the pixel region is defined by multiple pixel regions formed in the substrate. In some embodiments, the bump includes multiple bumps. In some embodiments, at least two bumps have thicknesses different from each other.

BRIEF DESCRIPTION OF THE DRAWINGS

The above and other advantages of the present disclosure will become more apparent by reference to the following detailed description of certain inventive aspects taken in conjunction with the accompanying drawings.

DETAILED DESCRIPTION OF CERTAIN INVENTIVE EMBODIMENTS

Figure 1:
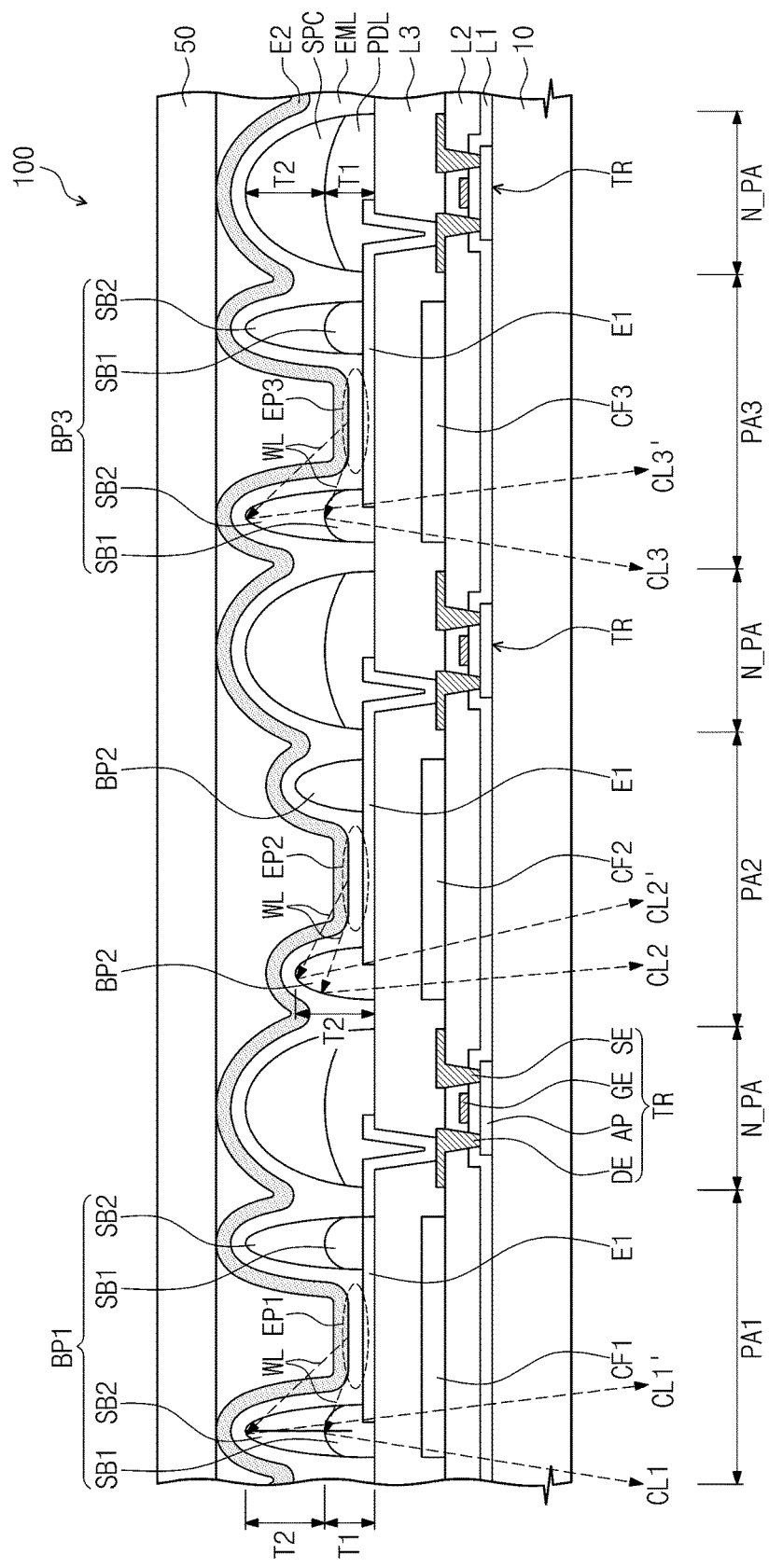
FIG. 1 is a cross-sectional view illustrating an organic electroluminescent display according to some embodiments of the present disclosure.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views. Accordingly, shapes of the exemplary views may be modified according to manufacturing techniques and/or allowable errors. Therefore, the embodiments of the disclosure are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the disclosure.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure. Exemplary embodiments of aspects of the disclosure explained and illustrated herein include their complementary counterparts. The same reference numerals or the same reference designators denote the same elements throughout the specification.

FIG. 1 is a cross-sectional view illustrating an organic electroluminescent display according to some embodiments of the disclosure. Referring to FIG. 1, an organic electroluminescent display 100 may include a plurality of pixel regions and a plurality of pixels disposed in the plurality of pixel regions. The organic electroluminescent display 100 may display an image using lights outputted from the plurality of pixels. Structures of a first pixel region PA1, a second pixel region PA2 and a third pixel region PA3 of the plurality of pixels are illustrated as an example in FIG. 1. The other pixel regions and the pixels in the other pixel regions are omitted in FIG. 1 for the purpose of ease and convenience in explanation. A structure of the organic electroluminescent display 100 will be described hereinafter.

The organic electroluminescent display 100 includes a substrate 10, an encapsulation substrate 50, driving transistors TR, first electrodes E1, a pixel defining layer PDL, a spacer SPC, an organic light emitting layer EML, a second electrode E2, first to third color filters CF1, CF2 and CF3, and first to third bumps BP1, BP2 and BP3.

The substrate 10 includes the first pixel region PA1, the second pixel region PA2, the third pixel region PA3, and a non-pixel region N_PA. The non-pixel region N_PA is disposed between two pixel regions adjacent to each other. In some embodiments, the organic electroluminescent display 100 may be a bottom emission type. In this case, the substrate 10 may have a transparent property like a glass substrate. Additionally, the substrate 10 may have a flexible property like a plastic substrate.

The encapsulation substrate 50 is disposed to face the substrate 10. The encapsulation substrate 50 covers elements such as the organic light emitting layer EML and blocks a gas or moisture inputted from the outside toward the organic light emitting layer EML. In other embodiments, an encapsulation layer may be provided instead of the encapsulation substrate 50. In this case, the encapsulation layer may cover the elements disposed on the substrate 10 and may block the gas or the moisture of the outside.

The first electrodes E1 may be disposed on the first to third pixel regions PA1, PA2 and PA3 in one-to-one correspondence. The driving transistors TR may be disposed on the non-pixel region N_PA. The driving transistors TR may be electrically connected to the first electrodes E1 in one-to-one correspondence. A structure of the first electrode E1 of the first pixel region PA1 and a structure of the driving transistor TR between the first and second pixel regions PA1 and PA2 will be described as an example hereinafter.

The driving transistor TR an active pattern AP, a source electrode SE, a drain electrode DE, and a gate electrode GE. The source electrode SE is electrically connected to a power line (not shown) disposed on the substrate 10. The source electrode SE is supplied with a power from the power line. The drain electrode DE is electrically connected to the first electrode E1. Thus, if the driving transistor TR is turned-on, the power signal may sequentially pass through the source electrode SE, the active pattern AP, and the drain electrode DE and then may be provided to the first electrode E1.

A first insulating layer L1 covers the active pattern AP to insulate the active pattern AP from the gate electrode GE. A second insulating layer L2 covers the gate electrode GE to insulate the gate electrode GE from the source electrode SE and the drain electrode DE. A third insulating layer L3 covers the source electrode SE and the drain electrode DE. The source electrode SE and the drain electrode DE may be electrically connected to the active pattern AP through contact holes formed in the first and second insulating layers L1 and L2. The drain electrode DE may be electrically connected to the first electrode E1 through a contact hole formed in the third insulating layer L3.

In some embodiments, the active pattern AP may include a semiconductor material, and the semiconductor material may include amorphous silicon or crystalline silicon. However, the disclosure is not limited to the kind of the semiconductor material. In other embodiments, the active pattern AP may include an oxide semiconductor (for example, IGZO, ZnO, $SnO_2$, $In_2O_3$, $Zn_2SnO_4$, $Ge_2O_3$, and/or $HfO_2$) and/or a compound semiconductor (for example, GaAs, GaP, and/or InP).

The first electrode E1 is disposed on the third insulating layer L3. The first electrode E1 is electrically connected to the drain electrode DE through the contact hole formed in the third insulating layer L3. In some embodiments, the first electrode E1 may act as an anode. The first electrode E1 may include a transparent conductive material such as indium-tin oxide (ITO) and/or indium-zinc oxide (IZO).

In some embodiments, the organic light emitting layer EML may be a single layer formed throughout the first to third pixel regions PA1, PA2 and PA3 and the non-pixel region N_PA. In this case, the organic light emitting layer EML may generate white light WL. The organic light emitting layer EML may include a first light emitting part EP1, a second light emitting part EP2, and a third light emitting part EP3. The first light emitting part EP1 may be disposed on the first electrode E1 of the first pixel region PA1 through an opened part of the pixel defining layer PDL corresponding to the first pixel region PA1. The second light emitting part EP2 may be disposed on the first electrode E1 of the second pixel region PA2 through an opened part of the pixel defining layer PDL corresponding to the second pixel region PA2. The third light emitting part EP3 may be disposed on the first electrode E1 of the third pixel region PA3 through an opened part of the pixel defining layer PDL corresponding to the third pixel region PA3.

The second electrode E2 is disposed on the organic light emitting layer EML. In some embodiments, the second electrode E2 may act as a cathode. The second electrode E2 may be a single layer formed throughout the first to third pixel regions PA1, PA2 and PA3 and the non-pixel region N_PA. If the organic electroluminescent display 100 is the bottom emission type, the second electrode E2 may include a reflective-conductive material such as a metal material. Thus, the white light WL may be reflected by the second electrode E2 and then the reflected white light WL may travel toward the first to third color filters CF1, CF2 and CF3 and the substrate 10.

The pixel defining layer PDL is disposed on the third insulating layer L3 of the non-pixel region N_PA. As described above, the pixel defining layer PDL may have the opened parts corresponding to the first to third pixel regions PA1, PA2, and PA3, respectively. In other embodiments, a hole-injection layer (not shown) and a hole-transport layer (not shown) may be disposed between each of the first electrodes E1 and each of the first to third light emitting parts EP1, EP2 and EP3, and an electron-transport layer (not shown) and an electron-injection layer (not shown) may be disposed between each of the first to third light emitting parts EP1, EP2 and EP3 and the second electrode E2.

The spacer SPC is disposed on the pixel defining layer PDL on the non-pixel region N_PA. Thus, the spacer SPC may be disposed between the substrate 10 and the encapsulation substrate 50 so that a gap between the substrate 10 and the encapsulation substrate 50 may be maintained.

The first to third color filters CF1, CF2 and CF3 are disposed on the first to third pixel regions PA1, PA2 and PA3 in one-to-one correspondence. In some embodiments, the first to third color filters CF1, CF2 and CF3 may be disposed on the second insulating layer L2. The first to third color filters CF1, CF2 and CF3 may convert the white light WL generated from the first organic light emitting layer EML and then reflected by the first to third bumps BP1, BP2 and BP3 into color lights.

In some embodiments, the first color filter CF1 may be a green filter, the second color filter CF2 may be a blue filter, and the third color filter CF3 may be a red filter. In this case, the white light WL may be transmitted through the first color filter CF1 to be converted into green light and then the green light may be outputted to the outside of the display 100 through the first pixel region PM. Likewise, the white light WL may be transmitted through the second color filter CF2 to be converted into blue light and then the blue light may be outputted to the outside of the display 100 through the second pixel region PA2. The white light WL may be transmitted through the third color filter CF3 to be converted into red light and then the red light may be outputted to the outside of the display 100 through the third pixel region PA3.

The first to third bumps BP1, BP2 and BP3 may be disposed on the third insulating layer L3 of the first to third pixel regions PA1, PA2 and PA3 in one-to-one correspondence. The first bump BP1 may be disposed over an edge of the first pixel region PA1 to surround the first light emitting part EP1 disposed over a center portion of the first pixel region PM. The second bump BP2 may be disposed over an edge of the second pixel region PA2 to surround the second light emitting part EP2 disposed over a center portion of the second pixel region PA2. The third bump BP3 may be disposed over an edge of the third pixel region PA3 to surround the third light emitting part EP3 disposed over a center portion of the third pixel region PA3.

A top surface of the first bump BP1 has a convex shape. Thus, a part of the white light WL generated from the first light emitting part EP1 may be reflected by the top surface of the first bump BP1 and then may be concentrated to the first pixel region PM. Likewise, top surfaces of the second and third bumps BP2 and BP3 have convex shapes. Thus, a part of the white light WL generated from the second light emitting part EP2 may be reflected by the top surface of the second bump BP2 and then may be concentrated to the second pixel region PA2. A part of the white light WL generated from the third light emitting part EP3 may be reflected by the top surface of the third bump BP3 and then may be concentrated to the third pixel region PA3.

In some embodiments, each of the first and third bumps BP1 and BP3 has a double-layered shape including a first sub-bump SB1 and a second sub-bump SB2 stacked on the first sub-bump SB1. In some embodiments, the second bump BP2 may have a single-layered shape. A top surface of each of the first and second sub-pumps SB1 and SB2 has a convex shape. Thicknesses of the first and third bumps BP1 and BP3 may be substantially equal to each other. A thickness of the second bump BP2 is less than that of each of the first and third bumps BP1 and BP3.

In more detail, the pixel defining layer PDL may have a first thickness T1 and the spacer SPC may have a second thickness T2 greater than the first thickness T1. In some embodiments, the first sub-bump SB1 may be formed at the same time as the pixel defining layer PDL. Thus, the first sub-bump SB1 may have the first thickness T1. The second sub-bump SB2 and the second bump BP2 may be formed at the same time as the spacer SPC. Thus, each of the second sub-bump SB2 and the second bump BP2 may have the second thickness T2. The thickness of each of the first and third bumps BP1 and BP3 is equal to a sum of the first and second thicknesses T1 and T2. Thus, the thickness of each of the first and third bumps BP1 and BP3 is greater than the thickness (i.e., the second thickness T2) of the second bump BP2.

When the first to third bumps BP1, BP2 and BP3 have different structures as described above, travelling paths of the white light WL from the first to third bumps BP1, BP2 and BP3 to the substrate 10 may differ from each other by the thicknesses of the first to third bumps BP1, BP2 and BP3. This will be described in more detail hereinafter.

The most part of the white light WL generated from the first light emitting part EP 1 may be reflected by the top surface of the second sub-bump SB2 of the first bump BP 1 and then may be converted into a main green light CL1' by the first color filter CF1. The main green light CL1' may be outputted to the outside through a center region of the first pixel region PM. Additionally, a part of the white light WL generated from an edge of the first light emitting part EP1 may be reflected by the top surface of the first sub-bump SB1 of the first bump BP1 and then may be converted into an edge green light CL1 by the first color filter CF1. The edge green light CL1 may be outputted to the outside through an edge region of the first pixel region PA1.

The most part of the white light WL generated from the second light emitting part EP2 may be reflected by the top surface of the second bump BP2 and then may be converted into a main blue light CL2' by the second color filter CF2. The main blue light CL2' may be outputted to the outside through a center region of the second pixel region PA2. Additionally, a part of the white light WL generated from an edge of the second light emitting part EP2 may be reflected by the top surface of the second bump BP2 and then may be converted into an edge blue light CL2 by the second color filter CF2. The edge blue light CL2 may be outputted to the outside through an edge region of the second pixel region PA2.

The most part of the white light WL generated from the third light emitting part EP3 may be reflected by the top surface of the second sub-bump SB2 of the third bump BP3 and then may be converted into a main red light CL3' by the third color filter CF3. The main red light CL3' may be outputted to the outside through a center region of the third pixel region PA3. Additionally, a part of the white light WL generated from an edge of the third light emitting part EP3 may be reflected by the top surface of the first sub-bump SB1 of the third bump BP3 and then may be converted into an edge red light CL3 by the third color filter CF3. The edge red light CL3 may be outputted to the outside through an edge region of the third pixel region PA3.

Referring to paths of the edge green, blue and edge lights CL1, CL2 and CL3 illustrated in FIG. 1, the edge green light CL1 travels close to an interface between the first pixel region PA1 and the non-pixel region N_PA adjacent to the first pixel region PA1, and the edge red light CL3 travels close to an interface between the third pixel region PA3 and the non-pixel region N_PA adjacent to the third pixel region PA3. In some embodiments, the edge blue light CL2 may be reflected by the second bump BPS having the thickness greater than that of the first sub-bump SB1. Thus, the edge blue light CL2 travels close to the center region of the second pixel region PA2 as compared with the edge green light CL1 and the edge red light CL3.

Meanwhile, a first effect means that light is uniformly outputted through an entire pixel region to improve uniformity of brightness throughout the pixel region. A second effect means that light is concentrated on a center region of a pixel region to improve front brightness of the pixel region. The edge green light CL1 and the edge red light CL3 may contribute to the improvement of the first effect. The edge blue light CL2 may contribute to the improvement of the second effect.

Thus, the first effect may be more improved than the second effect in the first pixel region PA1 by the edge green light CL1, and the second effect may be more improved than the first effect in the second pixel region PA2 by the edge blue light CL2. The first effect may be more improved than the second effect in the third pixel region PA3 by the edge red light CL3.

As described above, the first and second effects may differentially occur in the first to third pixel regions PA1, PA2 and PA3 since the structures of the first to third bumps BP1, BP2 and BP3 are not the same as each other. For convenience in explanation, the structure of each of the first and third bumps BP1 and BP3 may be defined as a double-layered bump and the second bump BP2 may be defined as a single-layered bump. The double-layered bump may be more profitable to improve the first effect than the second effect. The single-layered bump may be more profitable to improve the second effect than the first effect.

Thus, if the front brightness of blue light outputted from the second pixel region PA2 is less than the front brightness of green light outputted from the first pixel region PA1 or the front brightness of red light outputted from the third pixel region PA3, each of the first and third bumps BP1 and BP3 may be formed as double-layered bumps and the second bump BP2 may be formed as a single-layered bump. Thus, the second effect may be significantly improved over the first effect in the second pixel region PA2 outputting the blue light. Additionally, the front brightness of the green and red lights is more easily secured than the brightness of the blue light. Thus, the double-layered bump may be the first and third bumps BP1 and BP3 so that the first effect may be more improved than the first effect in the first and third pixel regions PA1 and PA3 outputting the green and red lights.

Meanwhile, in the present embodiment, the organic light emitting layer EML generating the white light WL has a single-layered shape through the first to third pixel regions PA1, PA2 and PA3 and the non-pixel region N_PA. However, in other embodiments, the organic light emitting layer EML and the first to third color filters CF1, CF2 and CF3 may be omitted, and a green organic light emitting layer, a blue organic light emitting layer and a red organic light emitting layer may be disposed on the first to third pixel regions PA1, PA2 and PA3 in one-to-one correspondence. In this case, if a luminous efficiency of the blue organic light emitting layer is less than those of the green and red organic light emitting layers, a front brightness of blue light generated from the blue organic light emitting layer may be relatively low. In this case, the single-layered bump may be the second bump such that the second effect may be significantly improved in the second pixel region PA2 on which the blue organic light emitting layer is formed.

Figure 2:
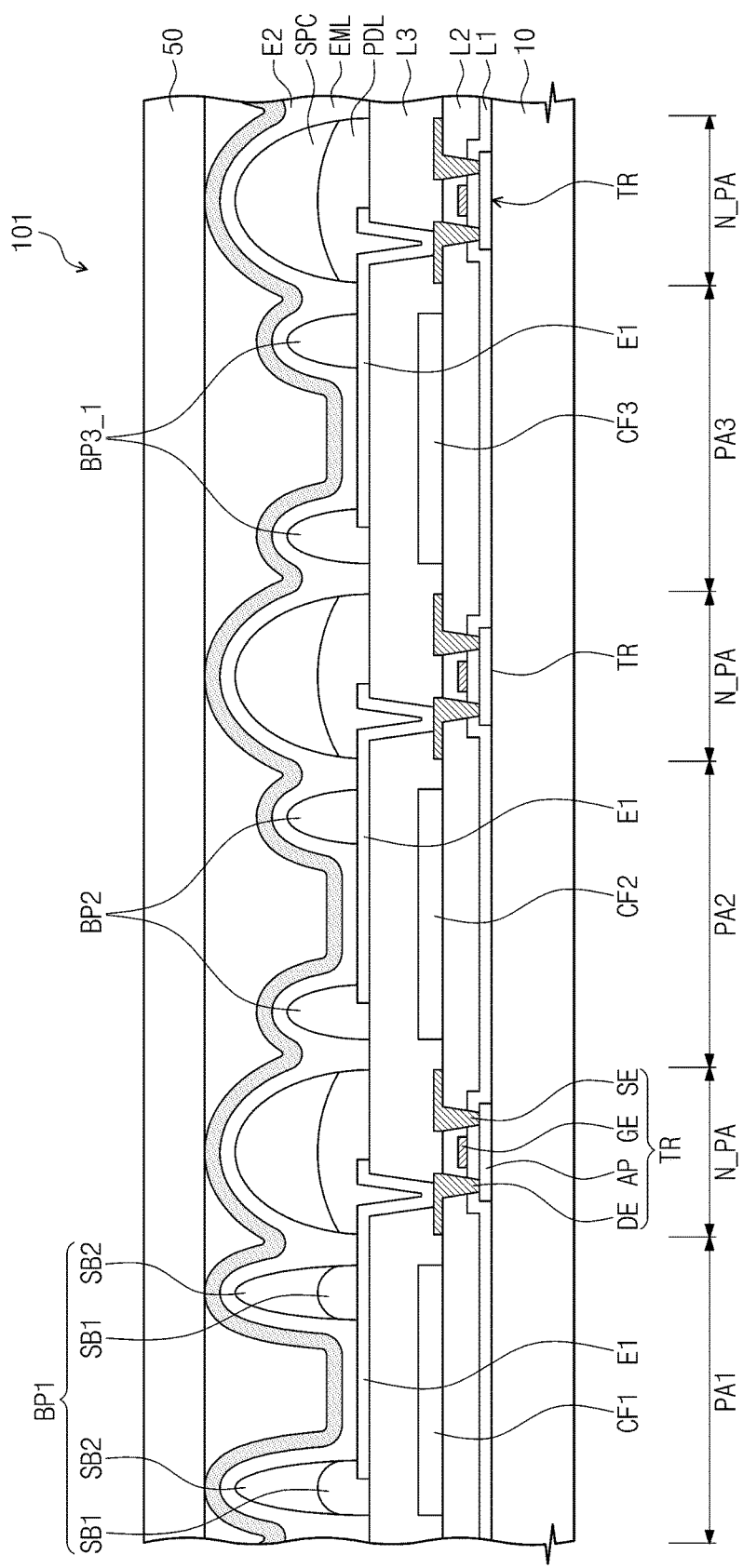
FIG. 2 is a cross-sectional view illustrating an organic electroluminescent display according to other embodiments of the present disclosure.

FIG. 2 is a cross-sectional view illustrating an organic electroluminescent display according to other embodiments of the disclosure. In the present embodiment, the same elements as described with reference to FIG. 1 will be indicated by the same reference numerals or the same reference designators. For ease and convenience in explanation, the descriptions to the same elements as described in the embodiment of FIG. 1 will be omitted or mentioned briefly. Referring to FIG. 2, an organic electroluminescent display 101 includes a first bump BP1, a second bump BP2, and a third bump BP3_1. The first bump BP1 has a double-layered bump structure, the second bump BP2 has a single-layered bump structure, and the third bump BP3_1 has a single-layered bump structure. In other words, unlike the organic electroluminescent display 100 illustrated in FIG. 1, the organic electroluminescent display 101 includes the third bump BP3_1 having the single-layered bump structure.

Thus, the second effect described with reference to FIG. 1, rather than the first effect, may be improved in the third pixel region PA3 outputting red light.

Figure 3:
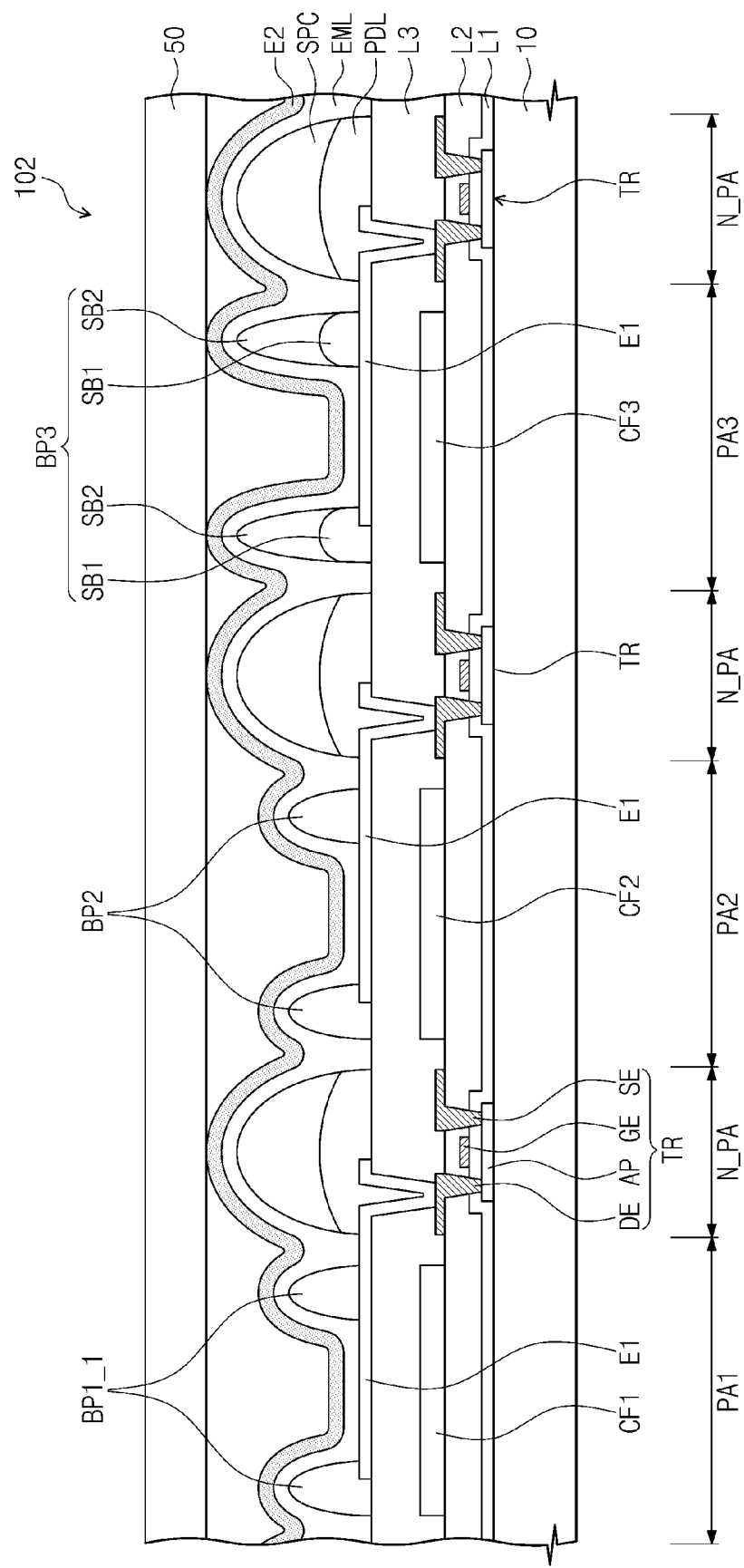
FIG. 3 is a cross-sectional view illustrating an organic electroluminescent display according to still other embodiments of the present disclosure.

FIG. 3 is a cross-sectional view illustrating an organic electroluminescent display according to still other embodiments of the disclosure. In the present embodiment, the same elements as described with reference to FIG. 1 will be indicated by the same reference numerals or the same reference designators. The descriptions to the same elements as described in the embodiment of FIG. 1 will be omitted or mentioned briefly. Referring to FIG. 3, an organic electroluminescent display 102 includes a first bump BP1_1, a second bump BP2, and a third bump BP3. The first bump BP1_1 has a single-layered bump structure, the second bump BP2 has a single-layered bump structure, and the third bump BP3 has a double-layered bump structure. In other words, unlike the organic electroluminescent display 100 illustrated in FIG. 1, the organic electroluminescent display 102 includes the first bump BP1_1 having the single-layered bump structure.

Thus, the second effect described with reference to FIG. 1, rather than the first effect, may be improved in the first pixel region PA1 outputting green light.

Figure 4:
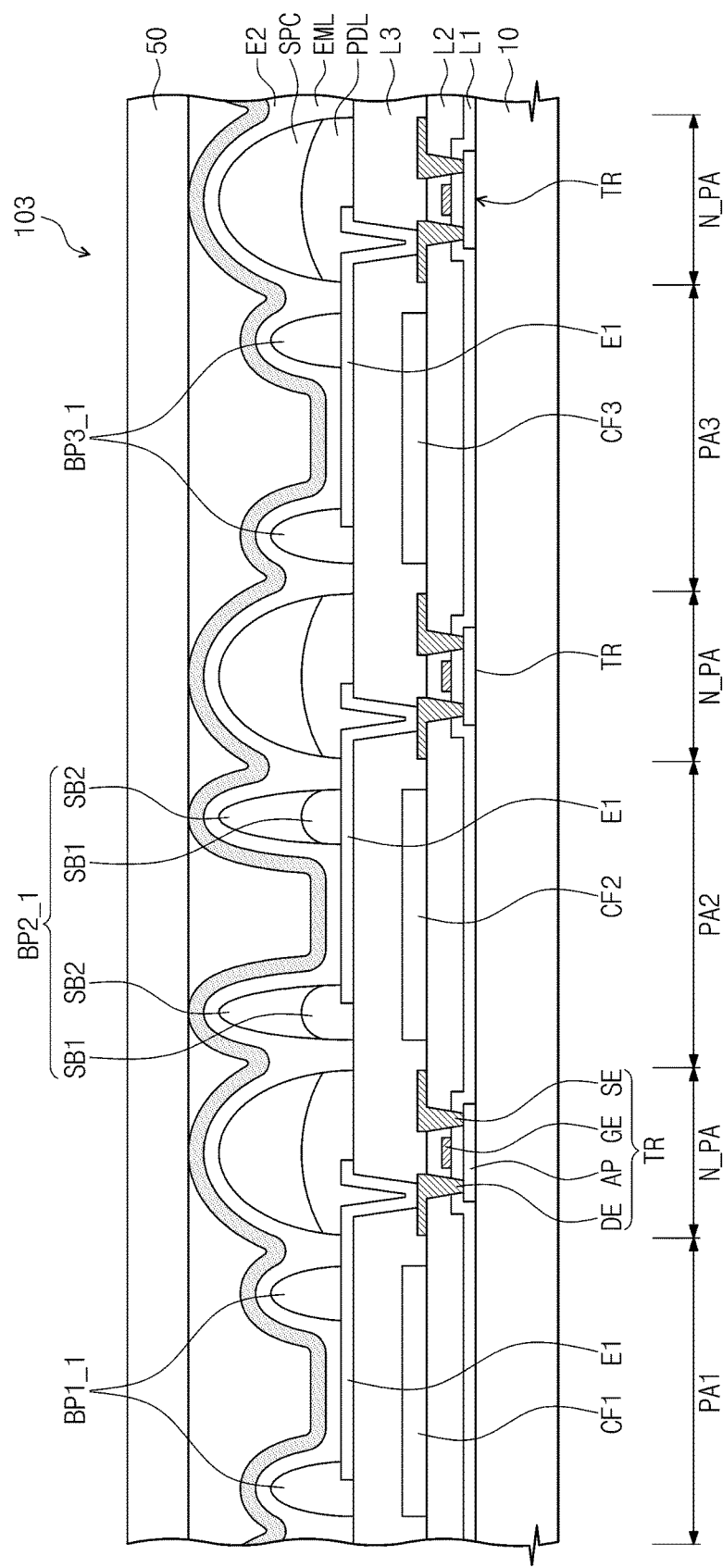
FIG. 4 is a cross-sectional view illustrating an organic electroluminescent display according to yet other embodiments of the present disclosure.

FIG. 4 is a cross-sectional view illustrating an organic electroluminescent display according to yet other embodiments of the disclosure. In the present embodiment, the same elements as described with reference to FIG. 1 will be indicated by the same reference numerals or the same reference designators. The descriptions to the same elements as described in the embodiment of FIG. 1 will be omitted or mentioned briefly. Referring to FIG. 4, an organic electroluminescent display 103 includes a first bump BP1_1, a second bump BP2_1, and a third bump BP3_1. The first bump BP1_1 has a singled-layered bump structure, the second bump BP2_1 has a double-layered bump structure, and the third bump BP3_1 has a single-layered bump structure.

Thus, unlike the organic electroluminescent display 101 illustrated in FIG. 1, the second effect rather than the first effect may be improved in the first pixel region PA1 outputting green light, and the first effect rather than the second effect may be improved in the second pixel region PA2 outputting blue light. The second effect rather than the first effect may be improved in the third pixel region PA3 outputting red light.

Figure 5:
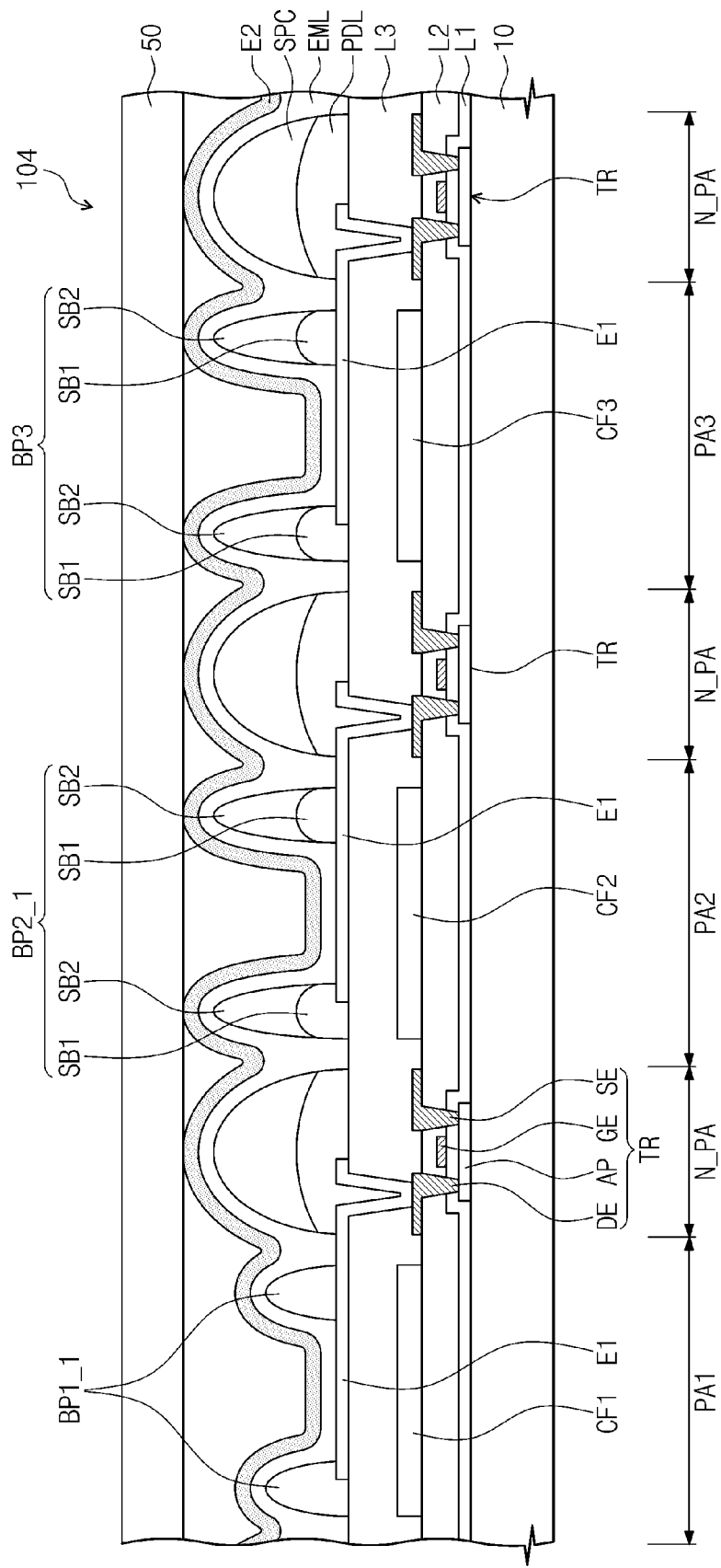
FIG. 5 is a cross-sectional view illustrating an organic electroluminescent display according to yet still other embodiments of the present disclosure.

FIG. 5 is a cross-sectional view illustrating an organic electroluminescent display according to yet still other embodiments of the disclosure. In the present embodiment, the same elements as described with reference to FIG. 1 will be indicated by the same reference numerals or the same reference designators. The descriptions to the same elements as described in the embodiment of FIG. 1 will be omitted or mentioned briefly. Referring to FIG. 5, an organic electroluminescent display 104 includes a first bump BP1_1, a second bump BP2_1, and a third bump BP3. The first bump BP1_1 has a singled-layered bump structure, the second bump BP2_1 has a double-layered bump structure, and the third bump BP3 has a double-layered bump structure.

Thus, unlike the organic electroluminescent display 101 illustrated in FIG. 1, the second effect rather than the first effect may be improved in the first pixel region PA1 outputting green light, and the first effect rather than the second effect may be improved in the second pixel region PA2 outputting blue light.

Figure 6:
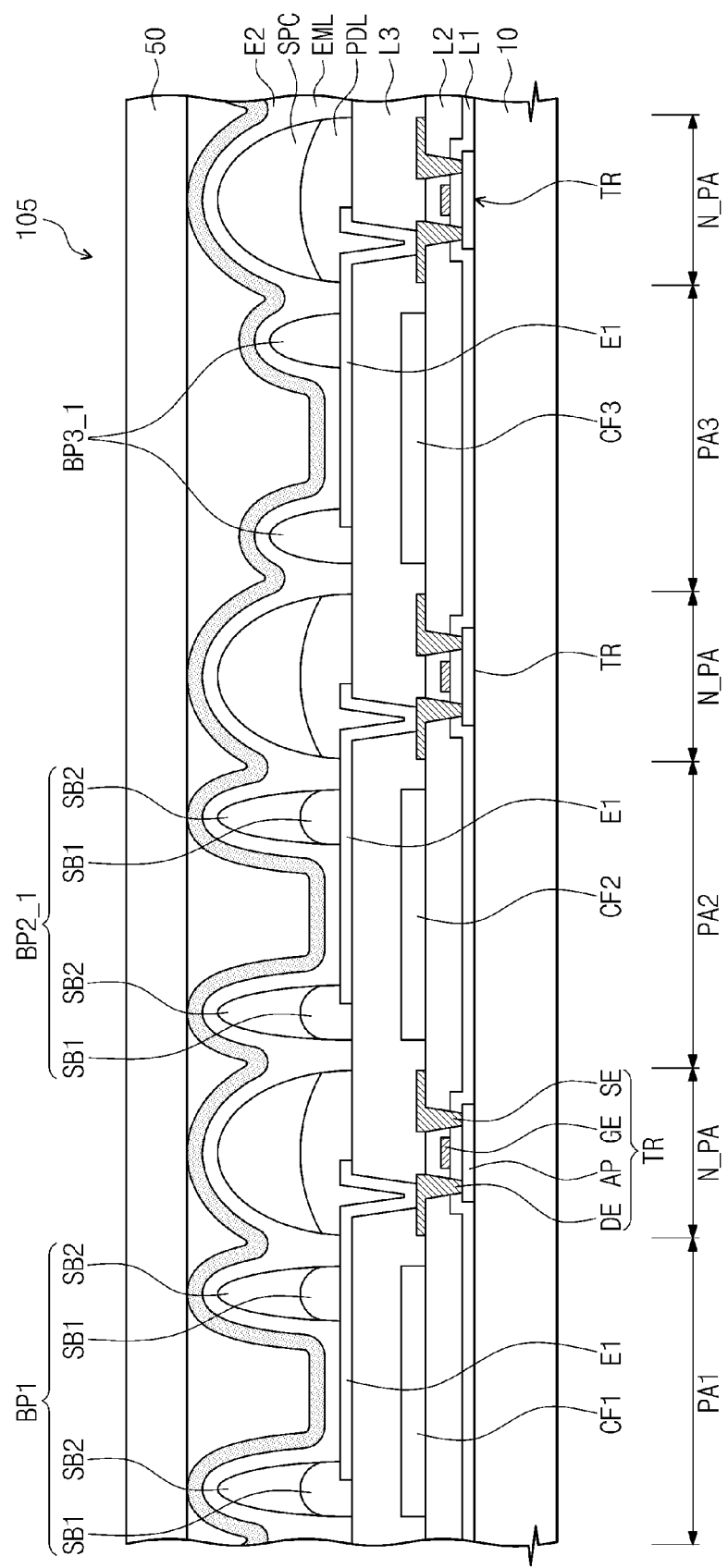
FIG. 6 is a cross-sectional view illustrating an organic electroluminescent display according to further embodiments of the present disclosure.

FIG. 6 is a cross-sectional view illustrating an organic electroluminescent display according to further embodiments of the disclosure. In the present embodiment, the same elements as described with reference to FIG. 1 will be indicated by the same reference numerals or the same reference designators. The descriptions to the same elements as described in the embodiment of FIG. 1 will be omitted or mentioned briefly. Referring to FIG. 6, an organic electroluminescent display 105 includes a first bump BP1, a second bump BP2_1, and a third bump BP3_1. The first bump BP1 has a double-layered bump structure, the second bump BP2_1 has a double-layered bump structure, and the third bump BP3_1 has a single-layered bump structure.

Thus, unlike the organic electroluminescent display 101 illustrated in FIG. 1, the first effect rather than the second effect may be improved in the second pixel region PA2 outputting blue light, and the second effect rather than the first effect may be improved in the third pixel region PA3 outputting red light.

According to the various embodiments described with reference to FIGS. 2 to 6, front brightness or brightness uniformity of color light outputted from a pixel region may be selectively and easily improved using the structure of the bump of the pixel region.

According to some embodiments of the disclosure, the thickness of the bump disposed on the pixel region may be controlled to improve the front brightness or the brightness uniformity of the light outputted through the pixel region. Thus, the thickness of the bump may be suitably designed to optimize the color of the light outputted through the pixel region and optical characteristics according to the color of the light. Thus, the characteristics of the light outputted from the pixel region may be easily controlled to improve the display quality of the organic electroluminescent display.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concept is to be determined by the broadest reasonable interpretation of the following claims and their equivalents, and shall not be restricted or limited by the foregoing description.

What is claimed is:

1. An organic electroluminescent display, comprising:
   a substrate having a pixel region and a non-pixel region when viewed in a direction substantially perpendicular to a top surface of the substrate;
   a first electrode formed on an area of the top surface corresponding to the pixel region of the substrate;
   an organic light emitting layer formed on the first electrode and capable of generating light;
   a second electrode formed on the organic light emitting layer and including a conductive material capable of reflecting the light generated by the organic light emitting layer;
   a pixel defining layer formed only on the non-pixel region of the substrate and having opened part corresponding to the pixel region of the substrate; and
   a bump formed on the opened part of the pixel defining layer and reflecting the light generated from the organic light emitting layer to the substrate,
   wherein the pixel region includes a plurality of pixel regions,
   wherein the bump includes multiple bumps,
   wherein at least two of the bumps have thicknesses different from each other, and
   wherein the pixel defining layer is non-overlapping with the pixel region of the substrate when viewed in the direction substantially perpendicular to the top surface of the substrate.

2. The organic electroluminescent display of claim 1, wherein a top surface of each of the bumps has a convex shape.

3. The organic electroluminescent display of claim 1, wherein the first electrode comprises a plurality of first electrodes corresponding to the plurality of pixel regions, wherein the opened part of the pixel defining layer includes a plurality opened parts of the pixel defining layer corresponding to the plurality of pixel regions, wherein light emitting parts of the organic light emitting layer are disposed on the plurality of first electrodes through each of the opened parts of the pixel defining layer, respectively, and wherein the light emitting part on one pixel region of the plurality of pixel regions is surrounded by the bump formed in the one pixel region.

4. The organic electroluminescent display of claim 1,
   wherein each of the plurality of pixel regions comprises:
      a first pixel region outputting a first color light;
      a second pixel region outputting a second color light having a color different from that of the first color light; and
      a third pixel region outputting a third color light having a color different from those of the first and second color lights,
   wherein each of the bumps comprises:
      a first bump disposed on the first pixel region;
      a second bump disposed on the second pixel region;
      and a third bump disposed on the third pixel region, and
   wherein at least two of the first, second and third bumps have thicknesses different from each other.

5. The organic electroluminescent display of claim 4, further comprising:
   a plurality of color filters formed on the plurality of pixel regions,
   wherein the plurality of color filters comprise:
      a first color filter disposed on the first pixel region to convert the light generated from the organic light emitting layer into the first color light, a second color filter disposed on the second pixel region to convert the light generated from the organic light emitting layer into the second color light, and a third color filter disposed on the third pixel region to convert the light generated from the organic light emitting layer into the third color light.

6. The organic electroluminescent display of claim 4, wherein the first color light is green light, wherein the second color light is blue light, and wherein the third color light is red light.

7. The organic electroluminescent display of claim 6, wherein thicknesses of the first and third bumps are equal to each other, and wherein a thickness of the second bump is less than the thickness of each of the first and third bumps.

8. The organic electroluminescent display of claim 6, wherein thicknesses of the second and third bumps are equal to each other, and wherein a thickness of the first bump is greater than the thickness of each of the second and third bumps.

9. The organic electroluminescent display of claim 6, wherein thicknesses of the first and second bumps are equal to each other, and wherein a thickness of the third bump is greater than the thickness of each of the first and second bumps.

10. The organic electroluminescent display of claim 6, wherein thicknesses of the first and third bumps are equal to each other, and wherein a thickness of the second bump is greater than the thickness of each of the first and third bumps.

11. The organic electroluminescent display of claim 6, wherein thicknesses of the second and third bumps are equal to each other, and wherein a thickness of the first bump is less than the thickness of each of the second and third bumps.

12. The organic electroluminescent display of claim 6, wherein thicknesses of the first and second bumps are equal to each other, and wherein a thickness of the third bump is less than the thickness of each of the first and second bumps.

13. The organic electroluminescent display of claim 4, wherein one of the first to third bumps is a single-layered bump, and wherein another of the first to third bumps is a double-layered bump having a thickness greater than a thickness of the single-layered bump.

14. The organic electroluminescent display of claim 13, wherein the double-layered bump comprises:
a first sub-bump; and
a second sub-bump formed on the first sub-bump,
wherein a top surface of each of the first and second sub-bumps has a convex shape.

15. The organic electroluminescent display of claim 14, wherein a thickness of the second sub-bump is greater than a thickness of the first sub-bump, and wherein the thickness of the second sub-bump is equal to the thickness of the single-layered bump.

16. The organic electroluminescent display of claim 15, further comprising:
an encapsulation substrate facing the substrate; and
a spacer disposed on the pixel defining layer, the spacer and the pixel defining layer maintaining a space between the substrate and the encapsulation substrate,
wherein a thickness of the spacer is equal to each of the thicknesses of the single-layered bump and the second sub-bump, and
wherein a thickness of the pixel defining layer is equal to the thickness of the first sub-bump.

17. The organic electroluminescent display of claim 1, wherein the organic light emitting layer has a single-layered shape formed throughout the pixel region and the non-pixel region, and wherein the light generated from the organic light emitting layer is white light.

18. The organic electroluminescent display of claim 1, wherein the plurality of pixel regions include a first region, a second region, and a third region.

19. The organic electroluminescent display of claim 18, wherein the first region includes a first bump formed over an edge of the first pixel region capable of outputting green light, wherein the second region includes a second bump formed over an edge of the second pixel region capable of outputting blue light, and wherein the third region includes a third bump formed over an edge of the third pixel region and capable of outputting red light.

20. The organic electroluminescent display of claim 19, wherein a top surface of the first bump has a convex shape, wherein a top surface of the second bump has a convex shape, wherein a top surface of the third bump has a convex shape, and wherein at least two of the first, second and third bumps have thicknesses different from each other.

* * * * *